(12) United States Patent
Choi et al.

(10) Patent No.: US 7,964,907 B2
(45) Date of Patent: Jun. 21, 2011

(54) INTEGRATED CIRCUIT DEVICE GATE STRUCTURES

(75) Inventors: Sam-jong Choi, Gyeonggi-do (KR);
Yong-kwon Kim, Gyeonggi-do (KR);
Kyoo-chul Cho, Gyeonggi-do (KR);
Kyung-soo Kim, Gyeonggi-do (KR);
Jae-ryong Jung, Gyeonggi-do (KR);
Tae-soo Kang, Gyeonggi-do (KR);
Sang-Sig Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 101 days.

(21) Appl. No.: 12/468,414

(22) Filed: May 19, 2009

(65) Prior Publication Data

US 2009/0236655 A1 Sep. 24, 2009

Related U.S. Application Data

(62) Division of application No. 11/510,059, filed on Aug. 25, 2006, now Pat. No. 7,550,347.

(30) Foreign Application Priority Data

Dec. 1, 2005 (KR) .................. 10-2005-0116528

(51) Int. Cl.
*H01L 21/00* (2006.01)
(52) U.S. Cl. ........ 257/316; 257/321; 257/322; 257/404; 257/E21.203; 257/E21.209; 257/E21.234; 257/E21.583; 257/E29.301; 257/E29.305; 257/E29.307
(58) Field of Classification Search .......... 257/316–322, 257/404, E21.209, 422, 582, 29.301–309, 257/E21.203–204, 234
See application file for complete search history.

(56) References Cited

U.S. PATENT DOCUMENTS

| | | | | |
|---|---|---|---|---|
| 5,281,543 | A | 1/1994 | Fukuzawa et al. | 437/29 |
| 5,783,498 | A | 7/1998 | Dotta | 438/778 |
| 5,852,346 | A | 12/1998 | Komoda et al. | 315/193.3 |
| 5,978,256 | A * | 11/1999 | Sohn et al. | 365/151 |
| 6,172,905 | B1 | 1/2001 | White et al. | 365/185.03 |
| 6,320,784 | B1 * | 11/2001 | Muralidhar et al. | 365/151 |

(Continued)

OTHER PUBLICATIONS

"High-k Metal Gate and Future Logic-Processed Technology", Technology & Research at Intel, http://www.intel.com/technology/silicon/si11031.htm, 3 pages, prior to Dec. 2005.

*Primary Examiner* — Michael S Lebentritt
(74) *Attorney, Agent, or Firm* — Myers Bigel Sibley & Sajovec

(57) ABSTRACT

Methods of forming a gate structure for an integrated circuit memory device include forming a first dielectric layer having a dielectric constant of under 7 on an integrated circuit substrate. Ions of a selected element from group 4 of the periodic table and having a thermal diffusivity of less than about 0.5 centimeters per second ($cm^2/s$) are injected into the first dielectric layer to form a charge storing region in the first dielectric layer with a tunnel dielectric layer under the charge storing region. A metal oxide second dielectric layer is formed on the first dielectric layer, the second dielectric layer. The substrate including the first and second dielectric layers is thermally treated to form a plurality of discrete charge storing nano crystals in the charge storing region and a gate electrode layer is formed on the second dielectric layer. Gate structures for integrated circuit devices and memory cells are also provided.

13 Claims, 14 Drawing Sheets

U.S. PATENT DOCUMENTS

| | | | |
|---|---|---|---|
| 6,400,610 B1 | 6/2002 | Sadd | 365/185.29 |
| 6,531,731 B2 | 3/2003 | Jones, Jr. et al. | 257/314 |
| 6,656,792 B2 * | 12/2003 | Choi et al. | 438/257 |
| 6,690,059 B1 * | 2/2004 | Lojek | 257/316 |
| 6,774,061 B2 | 8/2004 | Coffa et al. | 438/962 |
| 6,828,623 B1 | 12/2004 | Guo et al. | 257/321 |
| 6,912,158 B2 | 6/2005 | Forbes | 365/185.18 |
| 6,946,369 B2 | 9/2005 | Mazen et al. | 438/478 |
| 7,301,197 B2 * | 11/2007 | Lojek | 257/322 |
| 7,361,543 B2 * | 4/2008 | Steimle et al. | 438/201 |
| 7,449,398 B2 * | 11/2008 | Hwang | 438/513 |
| 7,682,970 B2 * | 3/2010 | Grigoropoulos et al. | 438/662 |
| 7,700,438 B2 * | 4/2010 | Liu et al. | 438/261 |
| 2005/0067659 A1 | 3/2005 | Gutsche et al. | 257/390 |
| 2005/0074939 A1 | 4/2005 | Ho et al. | 438/264 |
| 2005/0181624 A1 | 8/2005 | Kammler et al. | 438/766 |
| 2006/0105522 A1 | 5/2006 | Steimle et al. | 438/257 |
| 2006/0105524 A1 * | 5/2006 | Han et al. | 438/257 |
| 2007/0052011 A1 | 3/2007 | Bhattacharyya | 257/324 |
| 2007/0232041 A1 * | 10/2007 | Choi et al. | 438/585 |
| 2008/0230827 A1 * | 9/2008 | Bhattacharyya | 257/317 |

* cited by examiner

INTEGRATED CIRCUIT DEVICE GATE STRUCTURES

CROSS-REFERENCE TO RELATED APPLICATIONS

This application is a divisional of U.S. patent application Ser. No. 11/510,059 filed Aug. 25, 2006 now U.S. Pat. No. 7,550,347 which is related to and claims priority under 35 USC §119 from Korean Patent Application No. 10-2005-0116528, filed on Dec. 1, 2005, in the Korean Intellectual Property Office, the disclosures of which are incorporated herein by reference in their entireties.

BACKGROUND OF THE INVENTION

The present invention relates to integrated circuit devices and, more particularly, to gate structures of integrated circuit devices and methods of forming the same.

The increasing use of portable electronics and embedded systems has resulted in a need for low-power, high-density, non-volatile memories that can be programmed at very high speeds. One type of memory which has been developed is Flash electrically erasable programmable read only memory (Flash EEPROM). It is used in many portable electronic products, such as personal computers, cell phones, portable computers, voice recorders and the like as well as in many larger electronic systems, such as cars, planes, industrial control systems and the like.

A Flash EEPROM device is typically formed on an integrated circuit substrate, such as a semiconductor substrate. In portions of the surface of the substrate, a doped source region and a doped drain region are generally formed with a channel region therebetween. A tunnel silicon oxide dielectric layer may be formed on the semiconductor substrate over the channel region and between the source and drain regions. Above the tunnel silicon oxide dielectric layer, over the channel region, a stacked-gate structure is generally formed for a transistor having a floating gate layer, an inter-electrode dielectric layer and a control gate layer. The source region is typically located on one side of the stacked gate structure with one edge of the source region overlapping the gate structure. The drain region is generally located on the other side of the stacked gate structure with one edge overlapping the gate structure. The device may be, for example, programmed by hot electron injection and erased by Fowler-Nordheim tunneling as illustrated in FIG. 1.

A silicon (Si) nano crystal Flash EEPROM device has been proposed that can be programmed at fast speeds (hundreds of nanoseconds) using low voltages for direct tunneling and storage of electrons in the silicon nano crystals. By using nano crystal charge storage sites that are isolated electrically (discrete), charge leakage through localized defects in the gate oxide layer may be reduced as illustrated, for example, in FIG. 14. This may be contrasted with the continuous floating gate leakage path shown in FIG. 2.

A germanium (Ge) nano crystal Flash EEPROM device has also been proposed that can be programmed at low voltages and high speeds. Such a device may be fabricated by implanting germanium atoms into a silicon substrate. However, the implantation process can cause germanium to locate at the silicon-tunnel oxide interface, forming trap sites that can degrade the device performance. The presence of such trap sites places a lower limit to the thickness of the resulting tunnel oxide layer, because defect-induced leakage current in a very thin tunnel oxide can result in poor data retention performance.

A nano crystal charge trap triple layer structure having a tunneling oxide/Ge doped oxide/capping layer structure has also been proposed. Such a structure may have problems with a Capacitance-Voltage (CV) curve memory hysteresis characteristic drop, manufacturing process complication, leakage current and ion-out diffusion. The process complications may include difficulty in forming electron traps and a resulting overly thin tunnel oxide layer.

SUMMARY OF THE INVENTION

Some embodiments of the present invention provide methods of forming a gate structure for an integrated circuit memory device including forming a first dielectric layer having a dielectric constant of under 7 on an integrated circuit substrate. Ions of a selected element from group 4 of the periodic table and having a thermal diffusivity of less than about 0.5 centimeters per second ($cm^2/s$) are injected into the first dielectric layer to form a charge storing region in the first dielectric layer with a tunnel dielectric layer under the charge storing region. A metal oxide second dielectric layer is formed on the first dielectric layer, the second dielectric layer. The substrate including the first and second dielectric layers is thermally treated to form a plurality of discrete charge storing nano crystals in the charge storing region and a gate electrode layer is formed on the second dielectric layer.

In other embodiments, injecting ions further includes injecting the ions so as to provide a capping dielectric layer substantially free of injected ions on the charge storing region and the second dielectric layer is formed on the capping dielectric layer to a thickness of less than about 10 nm. Forming a second dielectric layer may include forming a high-k dielectric layer and forming a first dielectric layer may include forming a silicon oxide layer. The selected element may be germanium (Ge). The ions may be injected at a selected mean injection depth and with a delta projection range of no more than about 7 nanometers (nm).

In other embodiments, the ions are injected at a selected mean injection depth and with a delta projection range of from about 80 angstroms (Å) to about 120 Å. The first and second dielectric layers may have energy band gaps of at least about 5 electron volts (eV) and the first dielectric layer may have a thickness of less than about 17 nm and the thickness of the second dielectric layer may be less than the thickness of the first dielectric layer. The tunnel dielectric layer may have a thickness of no more than about 6 nm.

In further embodiments, the ions are injected at an ion injection energy of greater than 7000 electron volts (eV) and at an ion projection dose from about $1\times10^{14}/cm^2$ to about $2\times10^{16}/cm^2$. The ion injection energy may be no more than about 30000 eV. The nano crystals may have a diameter from about 1 nm to about 7 nm and a spacing between ones of the nano crystals is between about 1 nm and about 7 nm.

In other embodiments, thermally treating includes rapid thermal annealing the first dielectric layer at a temperature of about 700° C. to about 900° C. for about 5 minutes to about 30 minutes. This rapid thermal annealing may be followed by a second rapid thermal annealing at a temperature of about 900° C. to about 1050° C. for about 5 minutes to about 30 minutes. The second dielectric may be an oxide and/or oxynitride of aluminum, hafnium, titanium, zirconium, scandium, yitrium and/or lanthanum. Forming the first dielectric layer may include thermal oxidizing the substrate and forming the second dielectric layer may include forming the second dielectric layer by atomic layer deposition (ALD) and/or plasma enhanced chemical vapor deposition (PECVD).

In yet further embodiments, injecting ions includes injecting ions of the selected element at a first ion injection energy to form a first charge storing layer on the tunnel dielectric layer and injecting ions of the selected element at a second ion injection energy, less than the first ion injection energy, to form a second charge storing layer on the first charge storing layer with a region therebetween substantially free of implanted ions. Injecting ions may include injecting ions at a plurality of different height locations relative to the substrate in the first dielectric layer and thermally treating the substrate may provide a multi-layer structure of overlapping ones of the discrete charge storing nano crystals.

In other embodiments, forming the first dielectric layer is preceded by forming a common gate on a gate dielectric layer on the substrate. Forming the first dielectric layer, implanting ions, thermally treating and forming a second dielectric layer are carried out on sidewalls of the common gate electrode and on a channel portion of the substrate proximate respective sides of the common gate. Forming the gate electrode layer includes forming sidewall gates on the second dielectric layer proximate the respective sides of the common gate and extending over the channel portion.

In further embodiments, forming the first dielectric layer is preceded by forming a channel region including a recess region and a step region adjacent the recess region extending between a source and a drain region in the substrate. Forming the first dielectric layer, implanting ions, thermal treating and forming the second dielectric layer and gate electrode are carried out on the channel region including the recess region and the step region. The recess region may have a rounded portion. The integrated circuit device may be a non-volatile memory device or a dynamic random access memory (DRAM).

In yet other embodiments, methods of forming a gate structure for an integrated circuit memory device include forming a silicon oxide layer on an integrated circuit substrate and injecting ions of germanium (Ge) into the first dielectric layer at an ion injection energy of greater than 7000 electron volts (eV) and at an ion projection dose from about $1 \times 10^{14}/cm^2$ to about $2 \times 10^{16}/cm^2$ to form a charge storing region in the first dielectric layer with a tunnel dielectric layer of no more than about 6 nm under the charge storing region and a capping dielectric layer above the charge storing region. A metal oxide second dielectric layer having a thickness of less than about 10 nm is formed on the first dielectric layer. The substrate including the first dielectric layer and the second dielectric layer is rapid thermal annealed at a temperature of about 700° C. to about 900° C. for about 5 minutes to about 30 minutes to form a plurality of discrete charge storing nano crystals in the charge storing region. A gate electrode layer is formed on the second dielectric layer.

In further embodiments, gate structures for an integrated circuit device include an integrated circuit substrate and a first dielectric layer having a dielectric constant of under 7 on the substrate. The first dielectric layer includes a tunnel dielectric layer on the substrate and a charge storing layer including a plurality of discrete nano-crystals of a selected element from group 4 of the periodic table and having a thermal diffusivity of less than about 0.5 centimeters per second ($cm^2/s$) on the tunnel dielectric layer. A second dielectric layer is on the first dielectric layer. The second dielectric layer is a metal oxide and has a thickness of less than about 10 nm. A gate electrode layer is on the second dielectric layer.

In other embodiments, the first dielectric further includes a capping dielectric layer substantially free of nano-crystals on the charge storing layer and the second dielectric layer is on the capping dielectric layer. The second dielectric layer may be a high-k dielectric layer and the first dielectric layer may be a silicon oxide layer and the selected element may be germanium (Ge). The first and second dielectric layers may have energy band gaps of at least about 5 electron volts (eV) and the first dielectric layer may have a thickness of less than about 17 nm and the thickness of the second dielectric layer may be less than the thickness of the first dielectric layer. The tunnel dielectric layer may have a thickness of no more than about 6 nm. The nano crystals may have a diameter from about 1 nm to about 7 nm and a spacing between ones of the nano crystals may be between about 1 nm and about 7 nm. The second dielectric layer may be an oxide and/or oxynitride of aluminum, hafnium, titanium, zirconium, scandium, yitrium and/or lanthanum. The charge storing layer may include a multi-layer structure of overlapping ones of the discrete charge storing nano crystals.

In some embodiments, the integrated circuit device is a non-volatile memory device or a dynamic random access memory (DRAM). The integrated circuit device may be a flash memory device and the charge storing region may be a floating gate of a cell of the flash memory device.

Memory cells including the above described gate structures are also provided. The memory cells may further include a common gate on a gate dielectric layer on the substrate and the first dielectric layer may extend along sidewalls of the common gate electrode and on a channel portion of the substrate proximate respective sides of the common gate. The memory cell may further include sidewall gates on the second dielectric layer proximate the respective sides of the common gate and extending over the channel portion.

In some embodiments, the memory cells include a channel region including a recess region and a step region adjacent the recess region extending between a source and a drain region in the substrate and the first dielectric layer extends along the channel region including the recess region and the step region. The recess region may have a rounded portion.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
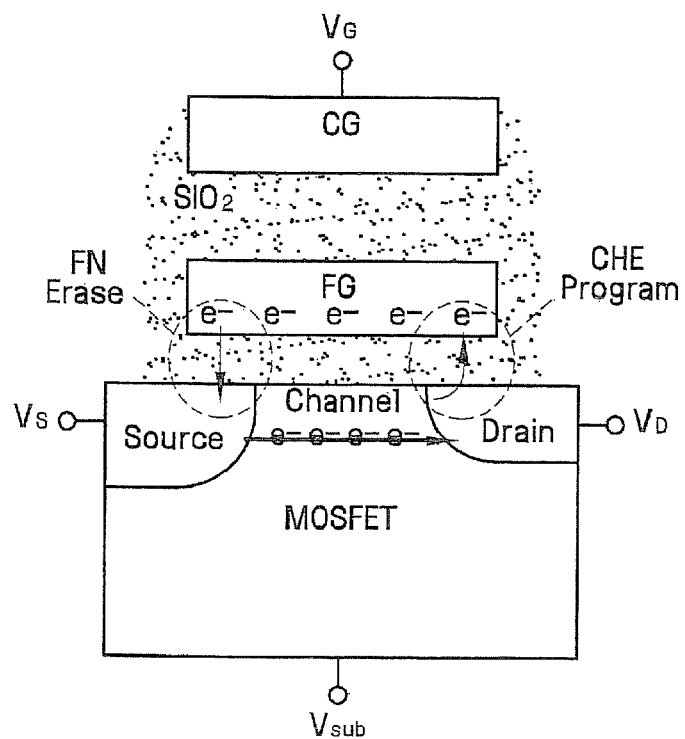
FIG. 1 is a schematic cross-sectional view illustrating erase and program operations in a conventional floating gate memory cell.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

In some embodiments of the present invention, as will now be described with reference to FIGS. 3A through 3D, a gate structure may be provided that is usable in a flash memory device or the like having source and drain regions in a substrate defining a channel region therebetween. A first dielectric layer is formed on the channel region and a second dielectric layer, having an energy band gap of over about 5 electron volts (eV) and a more thin structure than the first dielectric layer, is formed on the first dielectric layer. A plurality of charge storing nano crystals are embedded in the first dielectric layer and a control gate is provided on the second dielectric layer to provide a floating gate structure. The first dielectric layer, after embedding the charge storing nano crystals, may correspond to a tunnel oxide layer under the nano crystals and a portion of the first dielectrode layer above the nano crystals and second dielectric layers may correspond to coupling/capping and blocking layers with a charge storing layer therebetween including a plurality of discrete charge storing nano crystals.

Figure 3A:
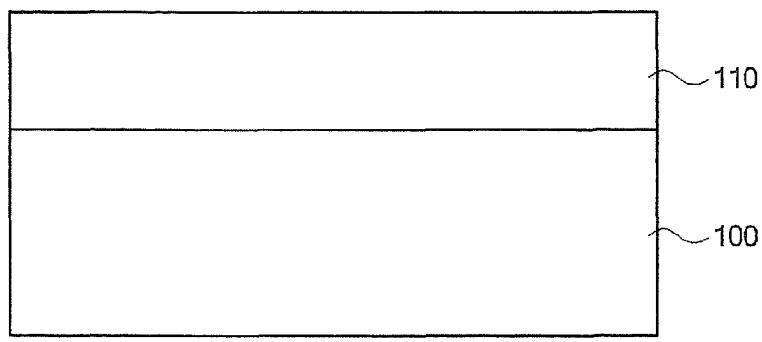
FIGS. 3A through 3D are cross-sectional views illustrating methods of forming a gate structure for an integrated circuit device according to some embodiments of the present invention.
Figure 16:
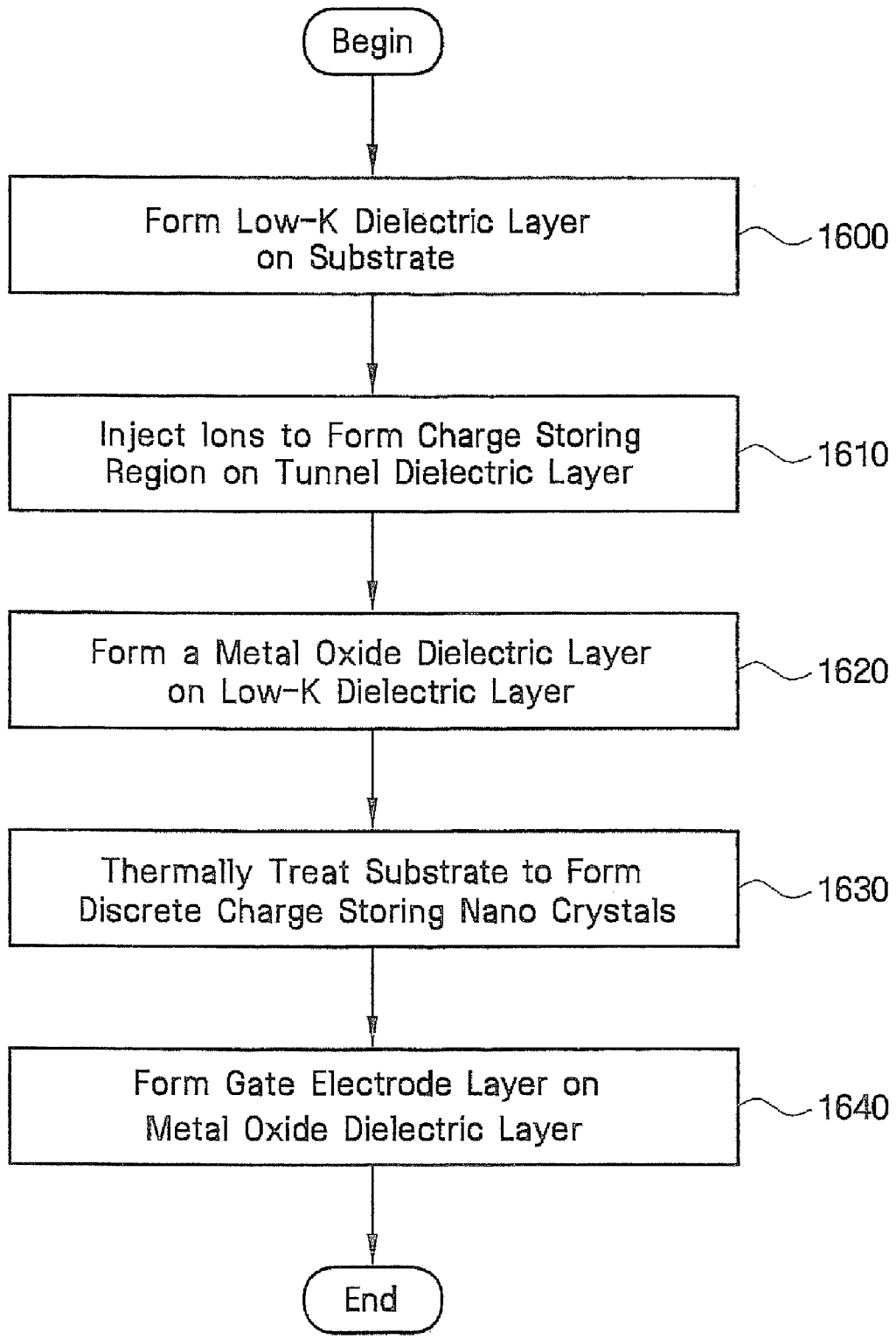
FIG. 16 is a flowchart illustrating operations for forming a gate structure for an integrated circuit device according to some embodiments of the present invention.

Referring now to the flow chart illustration of FIG. 16 and the cross sectional illustration of FIG. 3A, operations for forming a low-k dielectric layer at Block 1600 are shown in FIG. 3A where a first dielectric layer 110 is shown formed on an integrated circuit (semiconductor) substrate 100. The first dielectric layer 110 may be silicon oxide and may have an energy band gap of over about 5 eV. The thickness of the first dielectric layer 110 may be less than about 17 nanometers (nm) and, in some embodiments may, be about 15 nanometers, which may facilitate formation of a single nano crystal layer in the first dielectric layer 110.

Figure 3B:
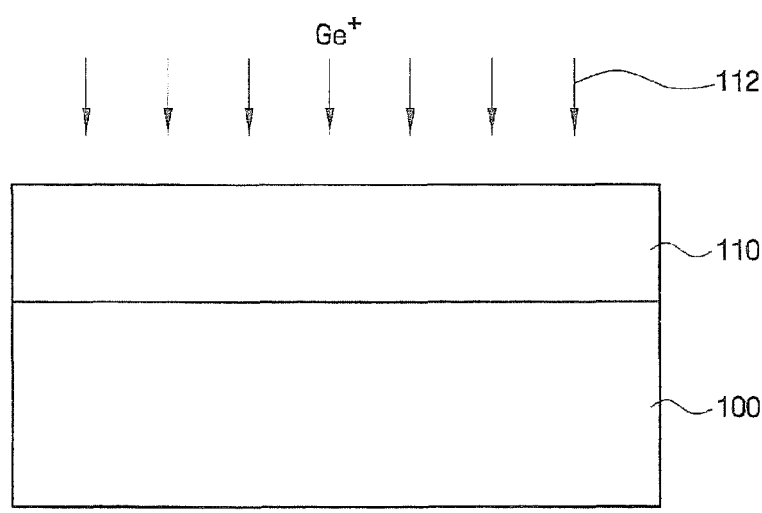

Operations for injecting ions into the first dielectric layer at Block 1610 to form a charge storing region are illustrated in FIG. 3B for some embodiments of the present invention. As seen in FIG. 3B, ions 112 of a selected element from Group IV (group 4) of the periodic table and having a thermal diffusivity of the less than about 0.5 centimeters per second ($cm^2/s$) are injected into the first dielectric layer 110 to form a charge storing region in the first dielectric layer 110 with a tunnel dielectric layer under the charge storing region. For example, as illustrated in FIG. 3B, the ion 112 of a selected element from Group IV may be germanium (Ge).

Table 1 below illustrates various property differences between germanium and silicon ions for injecting into a dielectric layer as described for various embodiments herein. As seen in Table 1, the dielectric constant (k) of germanium is larger than that of silicon and its energy band gap is smaller than that of silicon, which may allow operation of a formed charge storing layer and gate including such a layer at a lower voltage. As further seen in Table 1, the temperature for forming nano crystals is lower for germanium and its thermal diffusivity is smaller so that the nano crystals may more readily be formed at a desired depth location and with lower diffusion variability. Furthermore, as rapid thermal processing (RTP) may proceed at a lower temperature to provide annealing for germanium, a nano crystal signal layer may be more readily formed as heat treatment after ion implantation may result in a less spread out embedded nano crystal structure vertically and in other directions. During thermal processing, the germanium may be more readily prevented from outdiffusion than silicon. As a result, more uniform nano crystal size particles may be provided in a layer as adjacent nano crystals may be less likely to react with each other. Furthermore as the mobility of germanium is larger than that of silicon, it may be possible to operate a device including a gate structure as described herein where germanium is the injected ion at a higher speed than with silicon.

TABLE 1

| | | Ge | Si |
|---|---|---|---|
| Dielectric constant | | 16.0 | 11.9 |
| Energy band gap (eV) | | 0.66 | 1.12 |
| Nano crystal formation temp. (° C.) | | 700-950 | 950-1100 |
| Thermal diffusivity (cm2/s) | | 0.36 | 0.9 |
| Mobility (cm2/V-s) | Electron | 3900 | 1500 |
| | Hole | 1900 | 450 |

The conditions for ion injection at Block 1610 may be selected to provide a desired mean injection depth and delta projection range of the implanted layer. More particularly, a desired ion injection energy and ion projection dose may be selected using, for example, Transport of Ions In Matter (TRIM) simulation code.

In some embodiments, a delta projection range of no more than about 7 nanometers (nm) is provided about a selected mean injection depth. A delta ion projection range under 7 nm may allow a thickness of a dielectric layer 135 (FIG. 5) under the layer of discrete nano crystal discrete particles 130_NC (FIG. 5) to be no more than about 6 nm. In some embodiments of the present invention, ions are injected at a selected mean injection depth at Block 1610 with a delta projection range of from about 80 Å to about 120 Å.

In some embodiments of the present invention, the first dielectric layer 110 has a thickness of less than about 17 nm. Injecting ion operations at Block 1610 in some embodiments includes injecting the ions in an ion injection energy of greater than 7,000 eV and no more than about 30,000 eV and at an ion projection dose from about $1 \times 10^{14}$ $cm^2$ to about $2 \times 10^{16}$ $cm^2$.

Figure 3C:
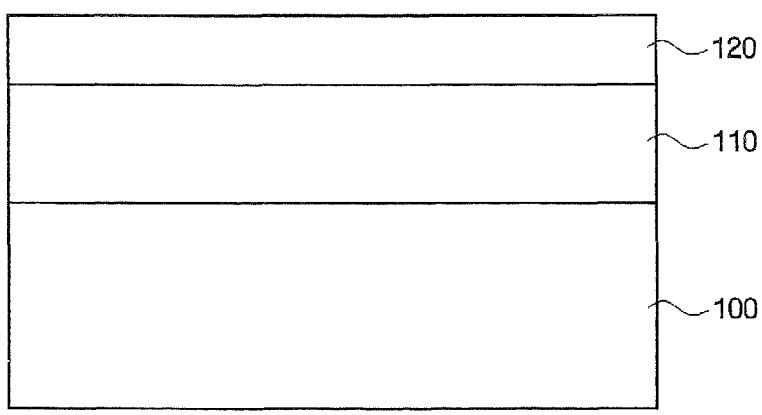

Referring now to FIG. 16 and FIG. 3C, a second dielectric (capping) layer 120 is formed on the first dielectric layer 110 (Block 1620). More particularly, the second dielectric layer 120 in some embodiments of the present invention is a metal oxide. In particular embodiments, the second dielectric layer 120 may be an oxide and/or oxynitride of aluminum, hafnium, titanium, zirconium, scandium, yitrium and/or lanthanum. The first dielectric layer 110 may be formed by thermal oxidation on the substrate 100 and the second dielectric layer 120 may be formed by atomic layer deposition (ALD) and/or plasma enhanced chemical vapor deposition (PECVD).

The metal oxide of the second dielectric layer 120 may be over 50 eV in energy band gap and may be a thinner and/or more dense layer than the first dielectric layer 110. The second dielectric layer 120 may operate to limit or block tunneling of electrons passing through the first dielectric layer 110 to a control gate formed on the second dielectric layer 120 during a programming operation. A thickness of the second dielectric layer 120 may be less than about 10 nm in some embodiments of the present invention, which may increase the capacitance of a gate including the second dielectric layer 120 to facilitate higher speed operation. A sampling of materials that may be used to form the second dielectric layer 120 include, for example, aluminum oxide ($Al_2O_3$), hafnium oxide ($HfO_2$) and zirconium oxide ($ZrO_2$), where aluminum oxide has a dielectric constant of 9 and an energy band gap of 8.7 eV, hafnium oxide has a dielectric constant of 25 and an energy band gap 5.7 eV and zirconium oxide has a dielectric constant of 25 and an energy band gap of 7.8 eV.

Figure 3D:
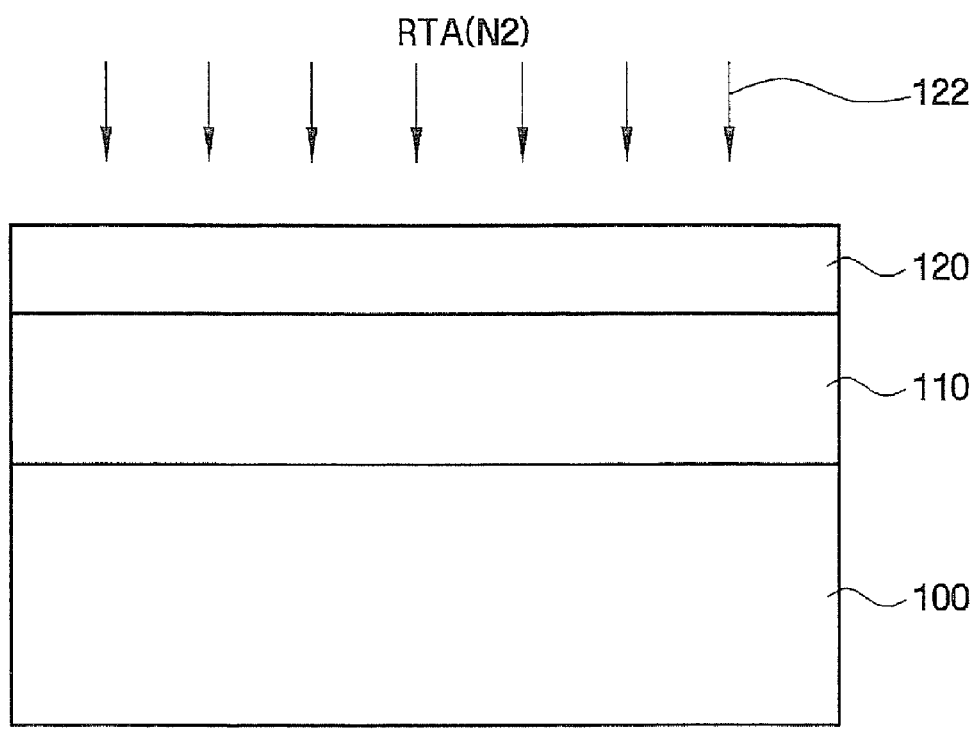

Operations related to thermally treating a substrate including the first 110 and second 120 dielectric layers to form a plurality of discrete charge storing nano crystals in a charge storing region of the first dielectric layer 110 is shown at Block 1620 of FIG. 16, will now be described with reference to FIGS. 3D and 4A-4B. As seen in the schematic illustration of FIG. 3D, in some embodiments of the present invention, rapid thermal annealing 122 is used as a thermal treatment to rapid thermal anneal the first dielectric layer 110. Rapid thermal annealing may be performed, for example, in an atmosphere of nitrogen ($N_2$) gas.

Figure 4A:
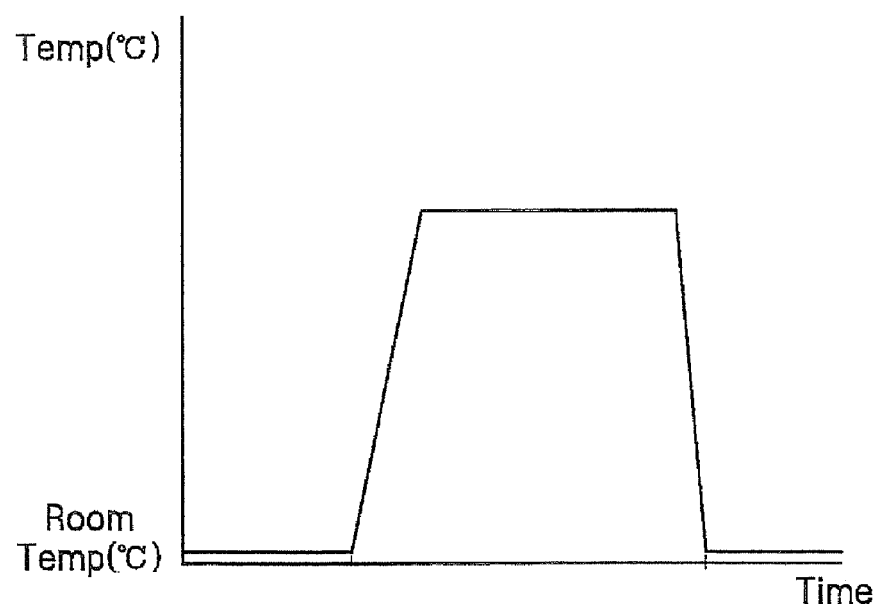
FIGS. 4A and 4B are diagrams illustrating heat treatments for forming a charge storing region including discrete charge storing nano crystals according to some embodiments of the present invention.
Figure 4B:
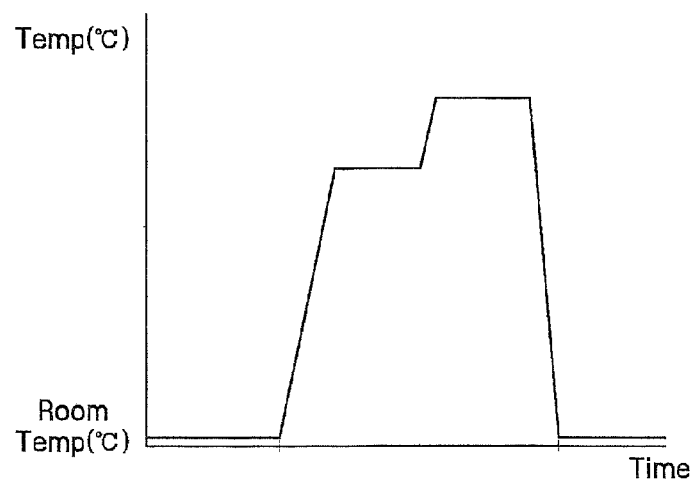

As shown in FIGS. 4A and 4B, a one step (FIG. 4A) or two step (FIG. 4B) annealing process may be used for operations at Block 1620 of FIG. 16. A single step thermal annealing may be performed at a temperature of about 700° C. to about 900° C. for about 5 minutes to about 30 minutes. In particular embodiments, the one step annealing is performed for 10 minutes. Referring now to FIG. 4B, the first thermal annealing may be under the same temperature conditions as described with reference to FIG. 4A so as to form discrete nano crystals in a charge storing region of the first dielectric layer 110. In some embodiments of the present invention, the nano crystals have a diameter from about 1 nm to about 7 nm and a spacing between ones of the nano crystals may be between about 1 nm and about 7 nm. In some embodiments, a substantially single layer of the nano crystals are formed in the first dielectric layer 110. In further embodiments, a range of diameters of the nano crystals may be between about 3 nm and about 7 nm.

As further shown in FIG. 4B, after formation of the nano crystals, a second annealing may be performed that may increase a compactness of the first dielectric layer 110 and may further cure or remediate the damage caused to the first dielectric layer 110 during ion injection. The second rapid thermal annealing, in some embodiments, may be at a temperature of about 900° C. to about 1050° C. for about 5 minutes to about 30 minutes. The relatively higher temperature of the second annealing may beneficially cure damage to the first dielectric layer 110.

Figure 5:
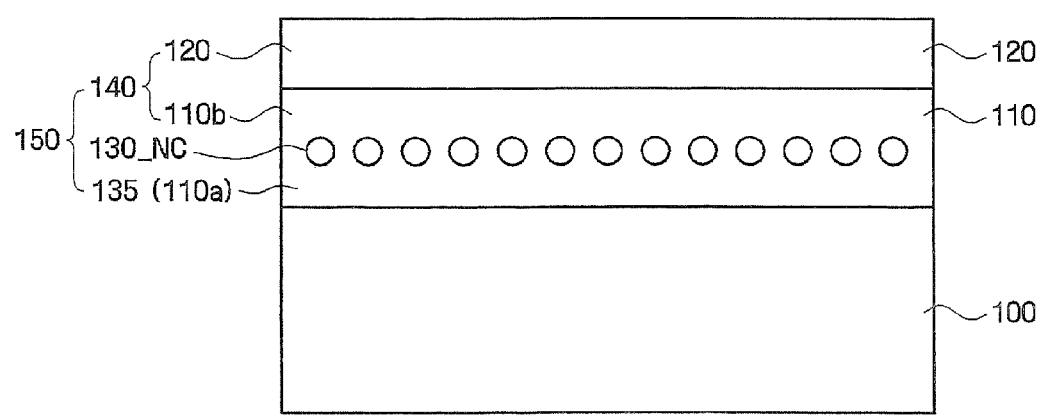
FIG. 5 is a cross-sectional view illustrating a charge trapping double layer structure according to some embodiments of the present invention.

A gate structure for an integrated circuit memory device according to some embodiments of the present invention will now be described with reference to the cross-sectional illustration of FIG. 5. FIG. 5 illustrates a charge trap double layer 150 including the annealed first dielectric layer 110 and the annealed second dielectric layer 120. A plurality of charge storing nano crystals 130_NC are embedded in the annealed first dielectric layer 110. A first dielectric layer region 110a under the nano crystals 130_NC forms a tunnel dielectric layer or tunnel oxide 125 under the charge storing region including the nano crystals 130_NC. The first dielectric layer region 110b above the nano crystals 130_NC and the second dielectric layer 120 correspond to coupling and blocking oxides 140. As used herein, the region 110b of the first dielectric layer 110 may be referred to as a coupling dielectric or oxide layer and the second dielectric layer 120 may be referred to as the blocking dielectric layer or oxide layer.

The tunnel dielectric layer 135, in some embodiments, has a thickness of no more than about 6 nm. The second dielectric layer 120 may have a thickness of less than about 10 nm. The first dielectric layer 110 may be silicon oxide and the second dielectric layer 120 may be a high-k dielectric layer.

When the first dielectric layer 110 is silicon oxide and the second oxide layer is a metal oxide, such as aluminum oxide, hafnium oxide or zirconium oxide, the annealed second dielectric layer 120 may include silicon therein diffused from the first dielectric layer 110 during annealing. The silicon atom content in the second dielectric layer 120 may have a concentration gradient decreased along the surface of the second dielectric layer 120 from the interface between the first 110 and second 120 dielectric layers. Similarly, the second dielectric layer 120 may include diffused ones of the implanted ions from the first dielectric layer 110, such as germanium ions, and the ion atom content in the second dielectric layer 120 may also have a concentration gradient decreased along the surface of the second dielectric layer from the interface between the first 110 and the second 120 dielectric layers. Such diffusion may be bi-directional in that the silicon oxide first dielectric layer 110 may also include aluminum, hafnium, zirconium or other metal from the second dielectric layer 120 that is diffused from the second dielectric layer 120 during annealing. As such, a metal content in the first dielectric layer 110 may have a concentration gradient decreased from the interfaced between the first 110 and second 120 dielectric layers towards the substrate 100.

As illustrated in FIG. 5, in some embodiments, the second dielectric layer 120 is less thick than the first dielectric layer 110. For example, as described at various points above, the second dielectric layer may have a thickness of about 10 nm while the first dielectric layer 110 may have a thickness of less than about 17 nm.

While shown in FIG. 5 as a single layer of discrete nano crystals 130_NC at a single mean injection depth, it will be understood that, in some embodiments of the present invention, a plurality of layers of discrete nano crystals 130_NC may be provided in the charge storing region of the first dielectric layer 110. In such embodiments, the multilayer structure may be provided by injecting ions of a selected element at a first ion injection energy to form a first charge storing layer on the tunnel dielectric layer 135 and injecting ions of a selected element at a second ion injection energy less than the first ion injection energy, to form a second charge storing layer at a different depth than the first charge storing layer, with the region therebetween substantially free of implanted ions. It will be understood that, as used herein, a multi-layer structure being substantially free of implanted ions allows for implantation of some ions based on the selected mean injection depths and the delta projection range characteristics of the ion injection processes. It will be further understood that, while described above with reference to two layers, ions may be injected at a plurality of different height locations relative to the substrate 100 in the first dielectric layer 110 and a thermal treatment process of the substrate 100 and first dielectric layer 110 and second dielectric layer 120 may provide a multi-layer structure of overlapping ones of the discrete charge storing nano crystals.

Figure 6:
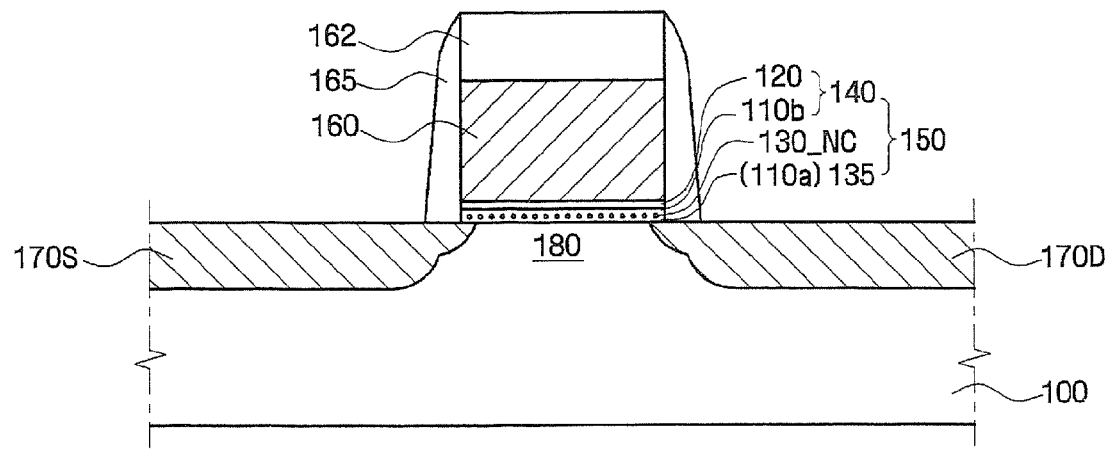
FIG. 6 is a cross-sectional view illustrating a flash memory device including a gate structure according to some embodiments of the present invention.

A flash memory device including a gate structure according to some embodiments of the present invention will now be described with reference to the cross sectional illustration of FIG. 6. As seen in FIG. 6, the flash memory device includes a substrate 100 having a source region 170S and a drain region 170D formed therein with a channel region 180 extending between the source 170S and drain 170D regions.

A charge trapping double layer 150 is formed on the channel region 180. The charge trap double layer 150 as illustrated includes a tunnel oxide layer 135 defined by a lower region 110a of the first dielectric layer 110. A thickness of the tunnel oxide layer 135 may be under 6 nm and, in some embodiments, may be from about 4.5 nm to about 5.5 nm. A thickness of the tunnel oxide layer 135 may be selected so as to be thin enough to provide for tunneling of electrons when a program voltage is applied to the flash memory device.

The discrete charged nano crystals 130_NC have a diameter of about 1 nm to about 15 nm in various embodiments and, in some embodiments, have a diameter between about 3 nm and about 7 nm. The nano crystals 130_NC may be dot type and a space between the nano crystals 130_NC may be between about 3 nm and about 7 nm. A distance between the nano crystals 130_NC may be selected to limit or even prevent lateral diffusion of charges. The illustrated charge trapping double layer 150 further includes the coupling and blocking oxide layer 140, including the region 110b of the first dielectric layer 110 and the second dielectric layer 120.

A gate electrode layer is formed on the substrate to define a control gate 160 on the second dielectric layer 120. The control gate 160 may be metal, doped polysilicon and/or the like. The control gate 160, while shown as a single layer structure in the embodiments of FIG. 6, may also be multi-layer structure.

Also shown in the flash memory device illustrated in FIG. 6 are sidewall spacer(s) 165 and a further capping layer 162. The sidewall spacer 165 is shown on each side of the control gate 160 and may be formed as a silicon oxide liner or the like.

While described with reference to FIG. 6 as a flash memory device, it will be understood that various embodiments of the present invention may provide a gate structure that may be used in a non-volatile memory device and/or dynamic random access memory device (DRAM). However, the embodiments described herein are described with reference to a floating gate structure, such as found on a flash memory device.

Figure 7A:
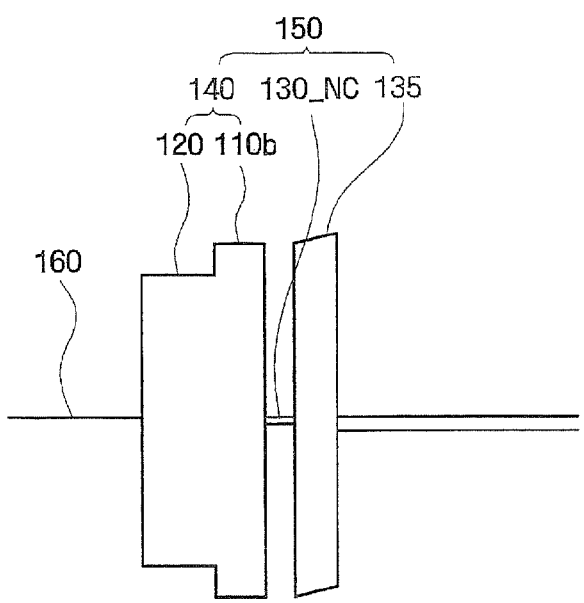
FIGS. 7A through 7C are energy band diagrams for a flash memory device according to some embodiments of the present invention.

Operation of the memory device of FIG. 6 will now be described further for some embodiments of the present invention with reference to the energy band diagrams of FIGS. 7A through 7C. FIG. 7A illustrates an initial state energy band diagram. In particular, FIG. 7A illustrates an embodiment in which the energy band gap for the first dielectric layer 110 is 9 eV and the first dielectric layer is silicon oxide. The energy band gap for the second dielectric layer 120 is 8.7 eV and the second dielectric layer is aluminum oxide. The energy band gap of the discrete nano crystals for germanium nano crystals 130_NC is 0.66 eV. The control gate 160 may be aluminum.

For the illustration in FIG. 7A, the tunnel oxide layer 135 may be silicon oxide having a thickness of about 6 nm. A mean diameter of the germanium nano crystals 130_NC may be 4 nm and a single layer of the nano crystals 130_NC may be provided. The coupling and blocking layer 140 as shown in FIG. 7A is for a silicon oxide region 110b of the first dielectric layer having a thickness of about 7 nm and for an aluminum oxide second dielectric layer 120 having a thickness of about 10 nm.

Erase and program operations for the exemplary energy band diagrams shown in FIG. 7A will now be described with reference to the illustrative energy band diagrams of FIGS. 7B and 7C respectively.

Figure 7B:
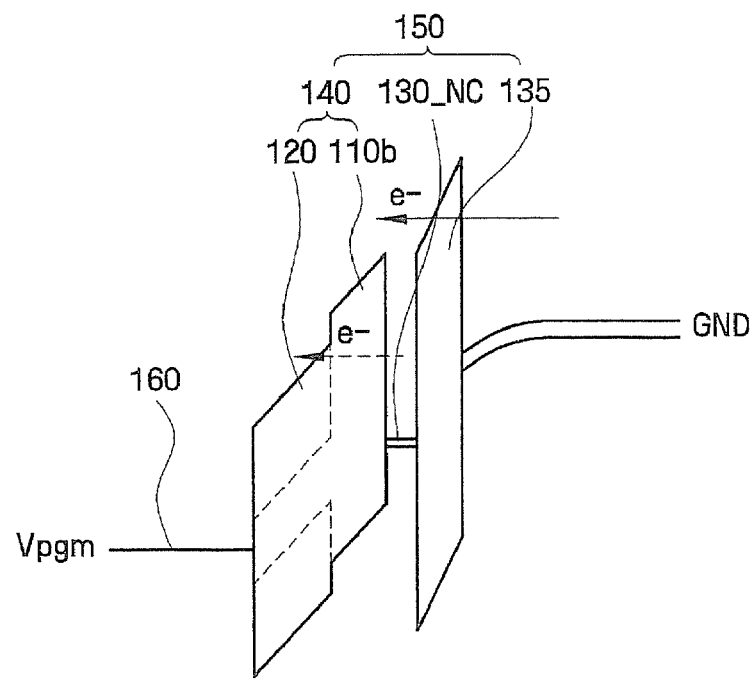
Figure 7C:
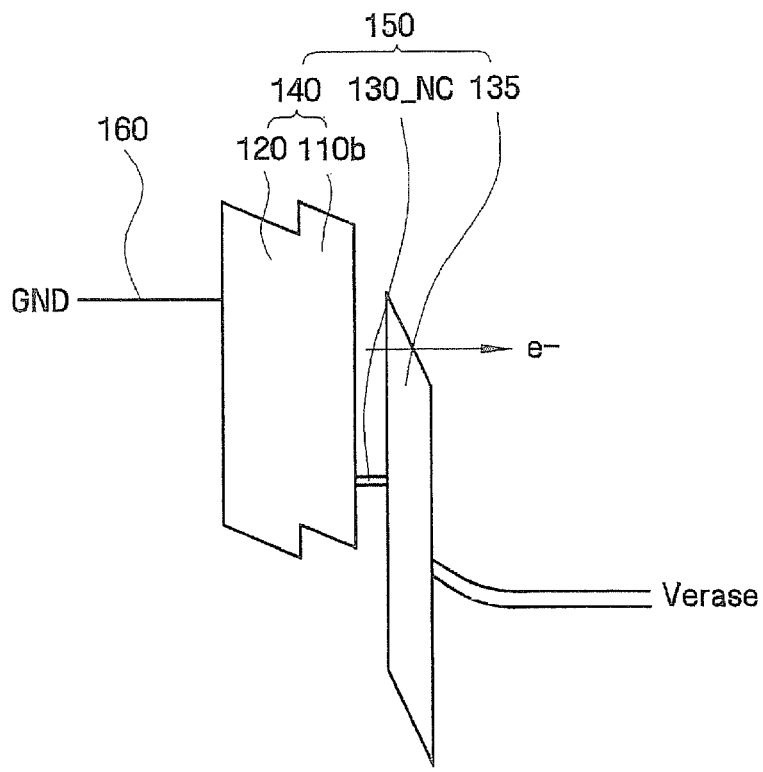

Referring to FIG. 7C, an erase operation state of the device shown in FIG. 6 is illustrated. In particular, a ground voltage is shown applied to the control gate 160 and a negative erasing voltage ($V_{erase}$) is shown applied to the substrate 100. As such, charge stored on the discrete charge storing nano crystals 130_NC is radiated towards the substrate 100 by FN tunneling and/or hot carrier injection as illustrated by the solid arrow line in FIG. 7C.

Referring now to FIG. 7B, a program operation state of the device of FIG. 6 will be described. As shown in FIG. 7B, a positive voltage ($V_{pgm}$) is applied to the control gate 160 and a ground voltage (GND) is applied to the substrate 100. As such, an electron traveling from the channel region 180 is trapped in the charge storing region including the discrete charge storing germanium nano crystals 130_NC after passing through the tunnel oxide layer 135 by FN tunneling. It will be understood, however, that when a positive programming voltage ($V_{pgm}$) is applied to the control gate 160 and a high voltage similar to $V_{pgm}$ is applied to the source region 170S and the ground voltage GND is applied to the drain region 170D, hot carrier electrons generated adjacent to the source region 170S can be injected and trapped by the nano crystals 130_NC after passing through the tunnel oxide layer 135 as shown by the solid arrow line in FIG. 7B. In other words, FN tunneling and/or hot carrier electron programming may be used in some embodiments of the present invention.

If a coupling ratio of the voltage applied to the control gate 160 is high, a higher voltage may be transferred to the nano crystals 130_NC. This may induce an effective injection of the FN tunneling and/or the hot carrier electron flow. In other words, it may be possible to make the non-volatile memory device operate quickly using the second dielectric film 120 made of high dielectric constant material such as a metal oxide.

As the energy band gap of the first dielectric film region 110b in some embodiments is about 8 to about 9 electron volts, if the energy band gap of the second dielectric film 120 is under 5 eV (see the dotted line in FIG. 7B), the trap charge in the nano crystals 130_NC may be further tunneled towards the control gate 160. As a result, the second dielectric film 120 in some embodiments of the present invention has an energy band gap of over 5 electron volts to provide performance in blocking tunneling of the electron charge from the nano crystals 130_NC towards the control gate 160.

Further embodiments of integrated circuit memory devices will now be described with reference to the cross sectional illustrations of FIGS. 8-11. Referring first to the embodiments illustrated in FIG. 8, a charge trap double layer 150 is illustrated formed on a portion of the channel region 180. The second dielectric layer 120 is formed as a gate dielectric layer on the remaining portion of the channel region 180. The control gate 160 is formed on the second dielectric layer 120. In other words, the charge trap double layer 150 in the embodiments illustrated in FIG. 8 does not extend fully across the channel region 180 as described with reference to the embodiments of FIG. 6. The configuration of embodiments illustrated in FIG. 8 may provide a reduced consumption of electricity of the memory device during operation and may, thereby, enhance programming and erasing efficiencies for the memory device.

Figure 8:
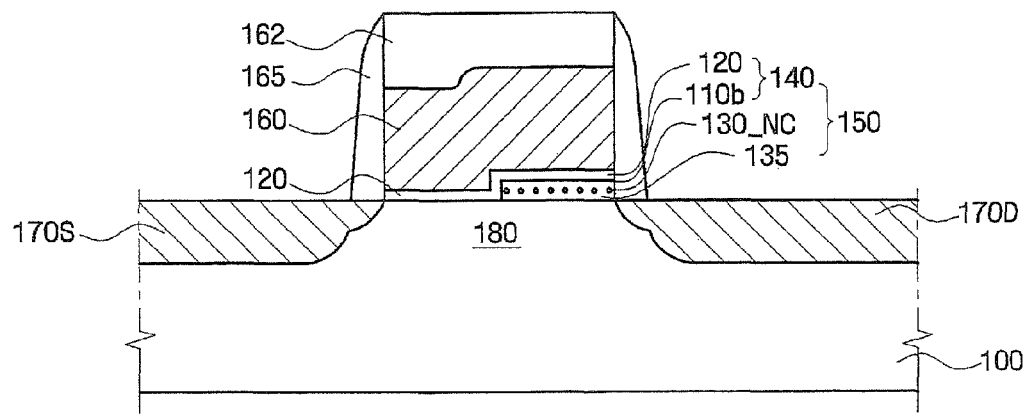
FIGS. 8 through 11 are cross-sectional views illustrating flash memory devices including gate structures according to further embodiments of the present invention.

The gate structure illustrated in FIG. 8 may be formed substantially as described previously herein. In particular, after the selected size of the first dielectric 110 is formed on the substrate 100, ions to be used for generating discrete charge storing nano crystals are injected into the formed first dielectric layer 110. The second dielectric layer 120 is formed covering the first dielectric layer 110 and on the substrate 100. The nano crystals 130_NC may then be formed in the first dielectric layer 110 by a thermal treatment, such as a rapid thermal annealing process as described previously.

Figure 9:
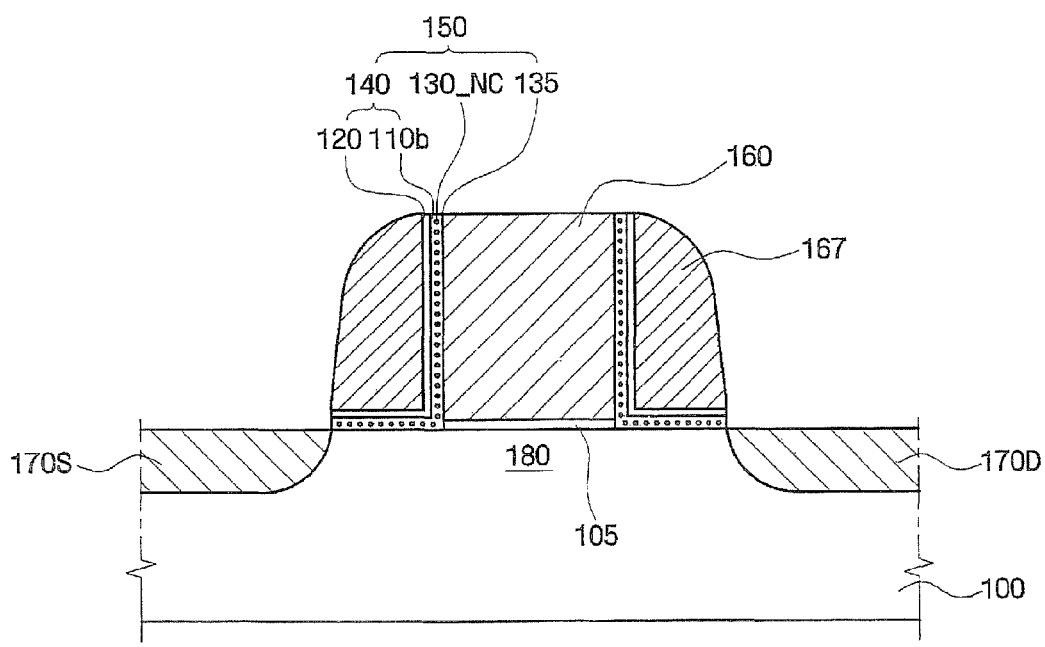

A flash memory device according to further embodiments of the present invention will now be described with reference to FIG. 9. As shown in the cross sectional view of FIG. 9, the charge trap double layer 150 is formed between a sidewall gate 167 and the channel region 180. The charge trapped double layer 150 is also shown extending between the sidewall gate 167 and the main control gate 160. A gate oxide layer 105 is shown formed between the control gate 160 and the substrate 100 in the channel region 180. After forming a gate oxide layer 105 and the control gate 160, the charge trap double layer 150 is formed on the resultant substrate 100. A conductive film for a sidewall gate may then be deposited. The sidewall gate 167 may be formed from the deposited conductive film, for example, by an etch-back process. The structure illustrated in FIG. 9 may, thus, provide a floating gate structure for a multi-bit memory cell.

The embodiments illustrated in FIG. 9 differ from the embodiments described with reference to FIG. 6 and FIG. 8 in that a common gate 160 is formed on a gate dielectric layer 105 and the substrate 100 before forming the first dielectric layer 110. Operations related to implanting ions and thermally treating the first dielectric layer 110 and the second dielectric layer 120 are further carried out on sidewalls of the common gate electrode 160 and on a portion of the channel region 180 of the substrate 100 proximate respective sides of the common gate 160. Sidewall gates 167 are formed on the second dielectric layer 120 proximate the respective sides of the common gate 160 and extending over a portion of the channel region 180 including the charge trap double layer 150.

Figure 10:
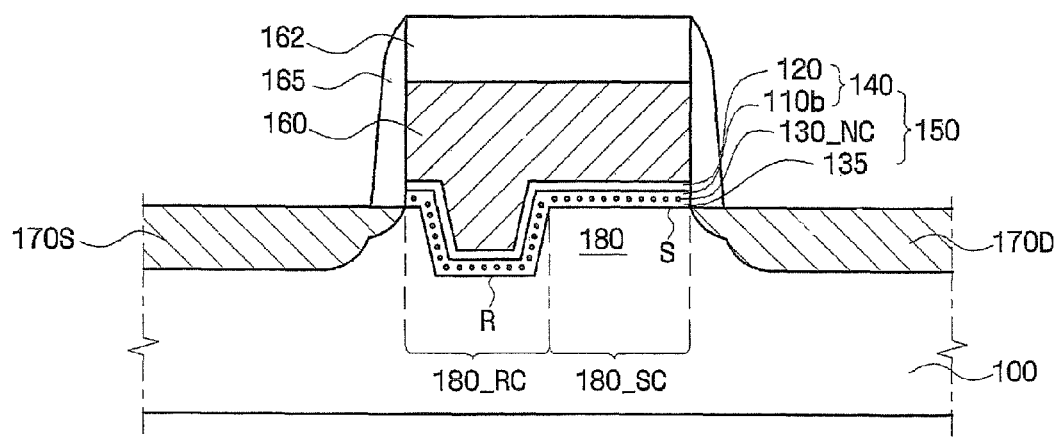

A memory cell structure according to further embodiments of the present invention will now be described with reference to FIG. 10. For the embodiments illustrated in FIG. 10, the channel region 180 includes a recess region 180_RC and step region 180_SC adjacent the recess region 180_RC, which regions extend between the source region 170S and the drain region 170D in the substrate 100. The charge trap double layer 150 is shown formed on the channel region 180 including the recess region 180_RC and the step region 180_SC. Also shown in the embodiments of FIG. 10 are sidewall spacer 165 and the further capping layer 162.

Figure 11:
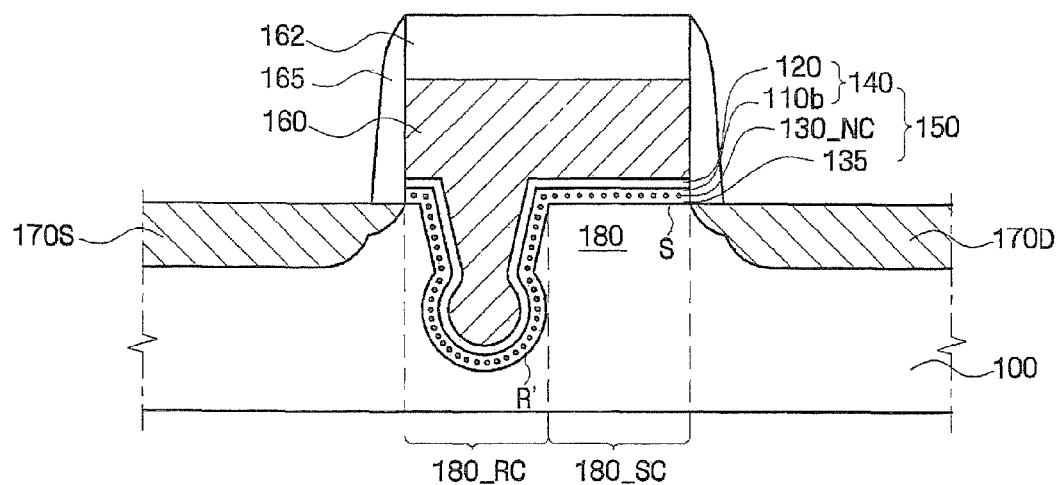

The memory cell structure illustrated in the embodiments of FIG. 11 is similar to that described with reference to FIG.

10. The embodiments illustrated in FIG. 11 differ from those of FIG. 10 in that the recess region 180_RC includes a rounded portion. The embodiments illustrated in FIGS. 10 and 11, like those in FIG. 9, may be suitable for use as a multi-bit storage cell of a memory device.

Figure 12A:
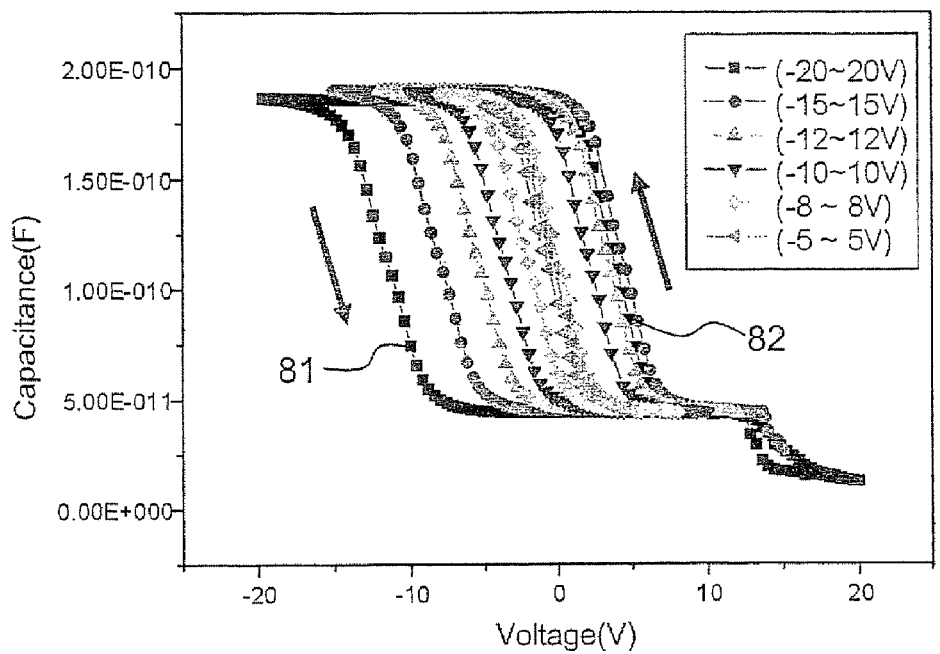
FIG. 12A is a capacitance-voltage (C-V) hysteresis curve for a flash memory device according to some embodiments of the present invention.

Operation of some embodiments of the present invention will now be further described with reference to the capacitance-voltage (C-V) hysteresis curves shown in FIGS. 12A through 12C. FIG. 12A illustrates operation characteristics for embodiments of the present invention when the selected element from group 4 of the periodic table used for the ions injected into the first dielectric layer 110 is germanium. More particularly, for the simulation results in FIG. 12A, germanium ions are injected at an ion projection dose of about $2\times10^{16}/cm^2$ at an ion injection energy of about 30 keV into a silicon oxide first dielectric layer 110 having a thickness of about 17 nm. The first dielectric layer 110 is grown by a thermal oxidation process on p-type substrate 100. An aluminum oxide second dielectric layer 120 is formed having a thickness of about 10 nm. Discrete charge storing nano crystals 130_NC are formed by rapid thermal annealing (RTA) in a nitrogen atmosphere at a temperature of about 800° C. for about 10 minutes. An aluminum control gate is formed on the second dielectric layer 120.

As illustrated in FIG. 12A, using embodiments of the present invention having a charge trap double layer 150, the capacitance moves in the direction 81 by a voltage sweep from a negative applied voltage to a positive applied voltage. In the reverse direction, the capacitance moves in the direction 82 by a voltage sweep from a positive applied voltage to a negative applied voltage. In other words, the embodiments illustrated in FIG. 12A have a desirable counter clock-wise hysteresis. The capacitance variation in the direction 81 represents that the interface between the silicon oxide layer 110 and the p-type substrate 100 may be changed to the inversion state through the cumulation of electrons. When the p-type substrate 100 surface reaches the inversion state, the electrons may be trapped in the germanium nano crystals 130_NC in the charge storing region of the first dielectric layer 110. On the other hand, the capacitance curve in the direction 82 has a positive flat band voltage shift due to the electron trapping in the discrete charge storing nano crystals 130_NC.

As further illustrated in the CV curve of FIG. 12A as the range of applied voltage increases, the hysteresis width increases by increasing the positive flat-band voltage shift. As such, as the applied voltage increases, the number of electrons trapped in the germanium nano crystals 130_NC may increase to accumulate more charge. In other words, better charge trapping may occur during programming to improve device operation and performance. As such, as illustrated in FIG. 12A, some embodiments of the present invention provide a counterclockwise hysteresis characteristic and a hysteresis width favorable to operation of a memory device.

Figure 12B:
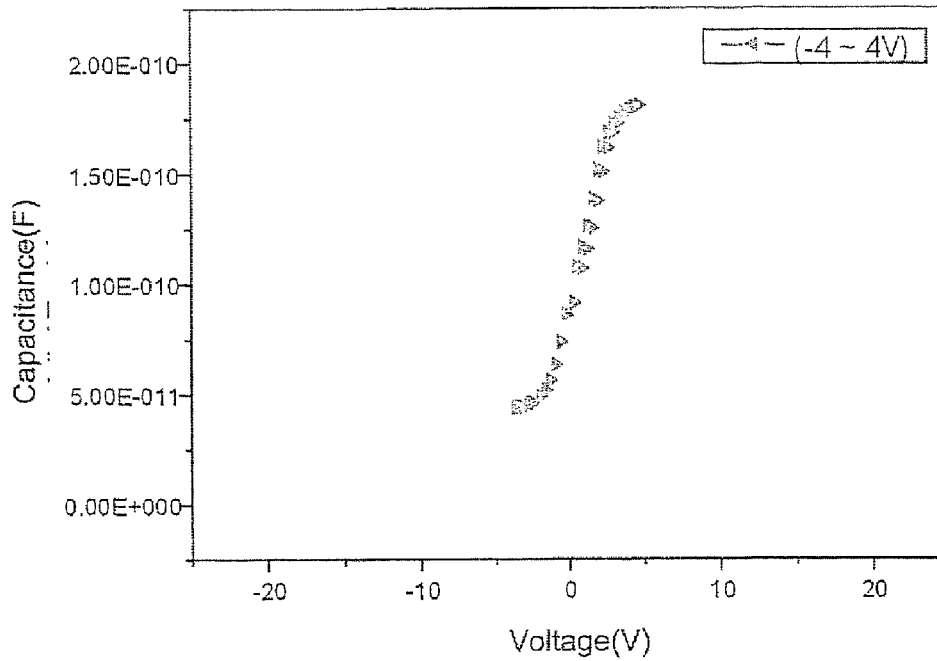
FIGS. 12B and 12C are capacitance-voltage (C-V) hysteresis curves for a flash memory device without a metal oxide capping layer.

For the C-V hysteresis curve illustrated in FIG. 12B, the second dielectric layer 120 is a silicon nitride layer having a thickness of about 30 nm, as contrasted with the 10 nm thickness aluminum oxide used for the embodiments illustrated in FIG. 12A. To the extent hysteresis is shown FIG. 12B, a clockwise hysteresis characteristic is present when a silicon nitride having a 5 eV energy band gap is used as the second dielectric layer 120.

Figure 12C:
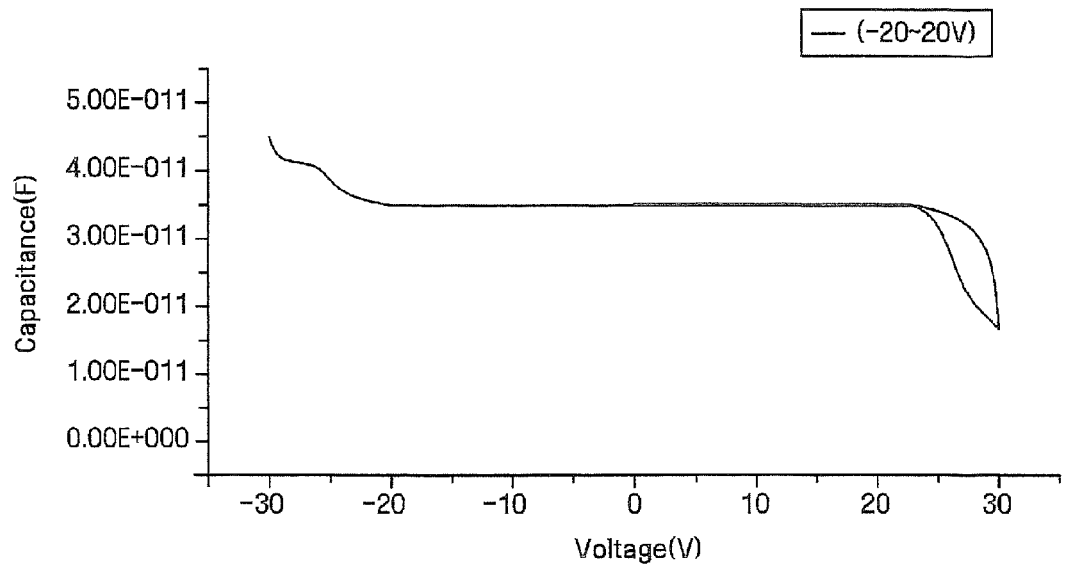

For the C-V hysteresis curve shown in FIG. 12C, a silicon oxide layer having a thickness of about 100 nm is used as the second dielectric layer 120 instead of the aluminum oxide shown in FIG. 12A. The hysteresis curve shown in FIG. 12C may not have a normal characteristic when silicon oxide is used as the second dielectric layer 120.

FIGS. 13A through 13E illustrate C-V hysteresis curves for various annealing temperatures used in forming the discrete charge storing nano crystals 130_NC in the charge storing region of the first dielectric layer 110. The curves illustrated in FIGS. 13A through 13E are based on a structure including germanium ions injected at an ion projection dose of about $2\times10^{16}/cm^2$ and an ion injection energy of about 7 keV into a silicon oxide first dielectric layer 110 grown by a thermal oxidization process on the p-type substrate 100 to a thickness of about 17 nm. Furthermore, an aluminum oxide second dielectric layer 120 having a thickness of about 10 nm is formed on the first dielectric layer 110.

A thermal treatment to form the discrete charge storing nano-crystals 130_NC is performed by rapid thermal annealing in a nitrogen atmosphere for a time of about 10 minutes at a different temperatures in each of the respective thickness. More particularly, FIG. 13A corresponds to a temperature of about 600° C., FIG. 13B corresponds to a temperature of about 700° C., FIG. 13C corresponds to a temperature of about 800° C., FIG. 13D corresponds to a temperature of about 900° C. and FIG. 13E corresponds to a temperature of about 950° C. An aluminum control gate is then formed on the resulting charge trap double layer 150.

Figure 13A:
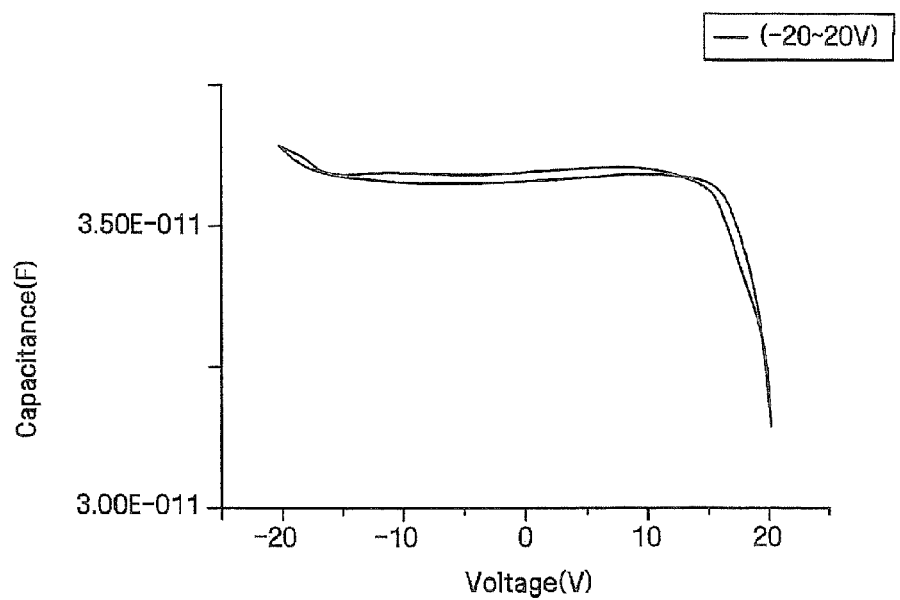
FIGS. 13A through 13E are capacitance-voltage (C-V) hysteresis curves for a flash memory device thermally treated at different temperatures according to some embodiments of the present invention.

For the illustrated C-V hysteresis curve at a temperature of 600° C. in FIG. 13A, a normal hysteresis characteristic is not provided. In the case of annealing at a temperature of about 950° C. is illustrated in FIG. 13E, an unstable clockwise hysteresis characteristic appears.

Figure 13B:
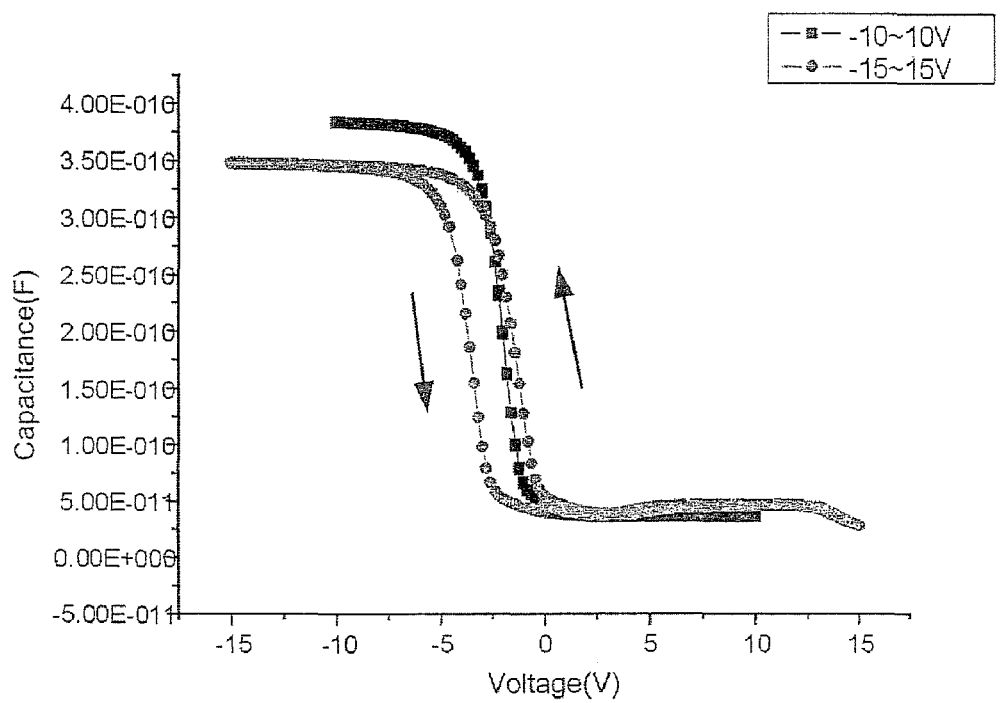
Figure 13C:
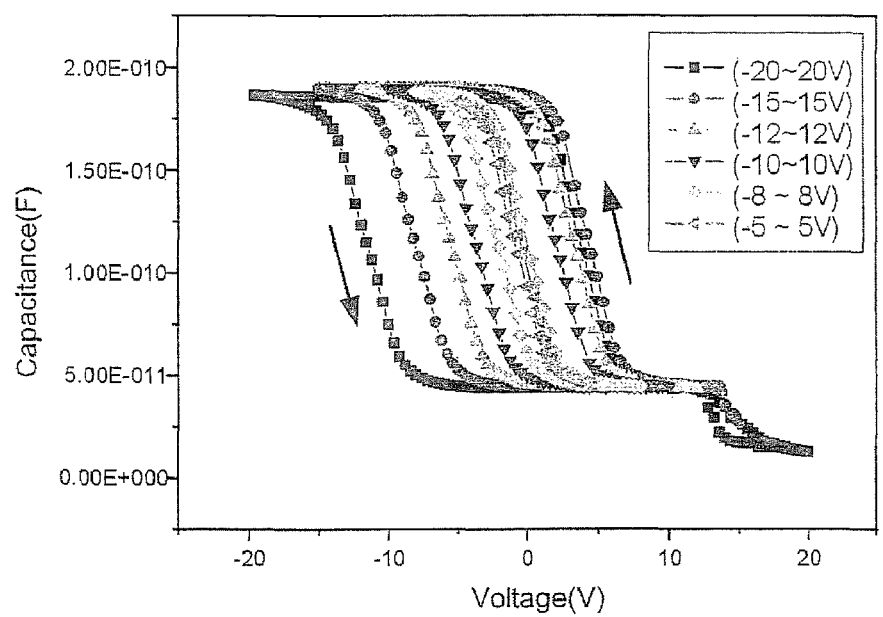
Figure 13D:
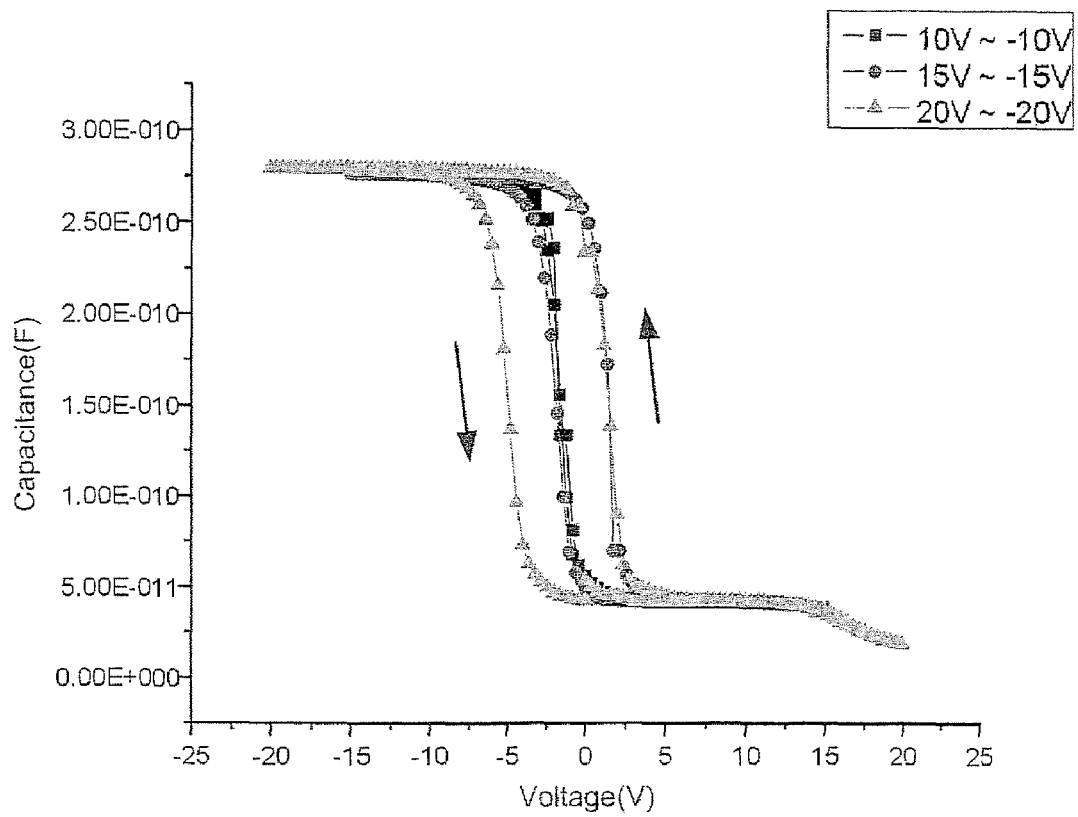
Figure 13E:
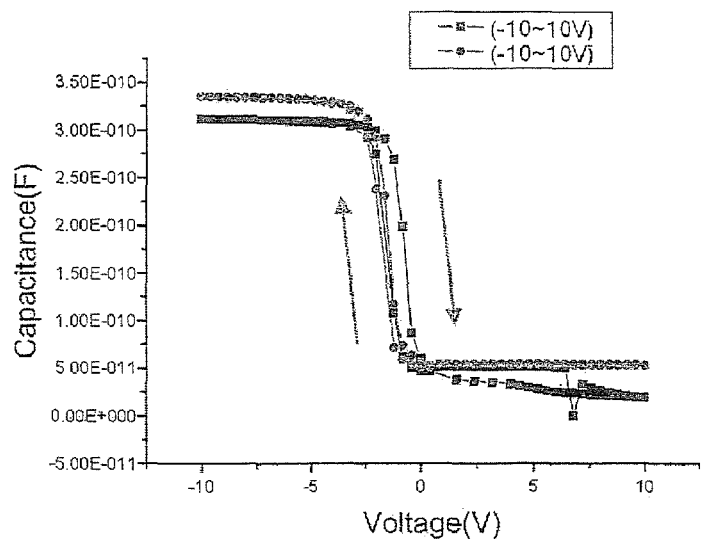

In contrast, for annealing at temperatures of 700° C., 800° C. and 900° C., as illustrated in FIGS. 13B through 13D, a desirable counterclockwise hysteresis characteristic is provided for a memory device. In particular, the C-V hysteresis curves shown for the annealing temperature of 800° C. in FIG. 13C may provide a particularly desirable memory hysteresis characteristic for some memory devices formed in embodiments of the present invention.

Further examples of hysteresis characteristics according to embodiments of the present invention are illustrated in Table 2 below. In particular, Table 2 provides examples of hysteresis characteristics at various germanium ion injection energies and various annealing temperatures for a device including an aluminum oxide second dielectric layer 120 at thicknesses of 10 nm and 20 nm respectively. In Table 2, a clockwise hysteresis characteristic is indicated by a CW and a counterclockwise hysteresis is indicated by CCW. Note that, as shown in the examples of Table 2, for an aluminum oxide thickness of under about 10 nm, and germanium ion injection energies of 7 to 30 keV at annealing temperatures of 700° C. to 900° C. for 10 minutes or less, favorable device characteristics are shown.

TABLE 2

| | Temp./Time (° C./Min) | 1 KeV | 3 KeV | 5 KeV | 7 KeV/30 kEv |
|---|---|---|---|---|---|
| Al2O3 (10 nm) | 700/10 | C.W | C.W | C.W | C.C.W |
| | 800/10 | C.W | C.W | C.W | C.C.W |
| | 800/30 | C.W | C.W | C.W | C.W |
| | 900/10 | C.W | C.W | C.W | C.C.W |
| Al2O3 (20 nm) | 800/10 | C.W | C.W | C.W | C.W |
| | 800/30 | C.W | C.W | C.W | C.W |
| | 900/10 | C.W | C.W | C.W | C.W |

Figure 2:
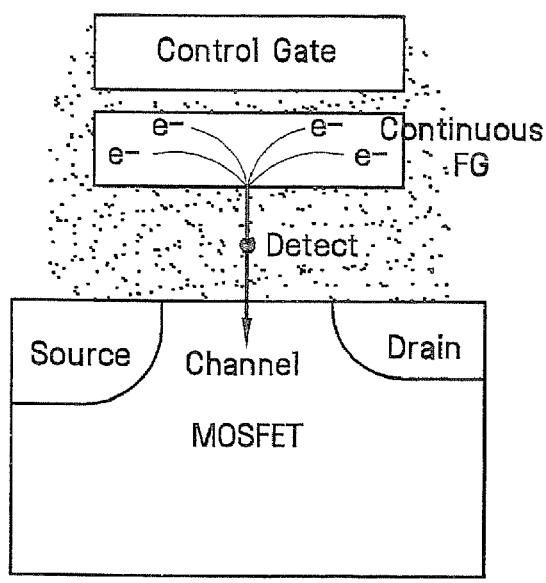
FIG. 2 is a schematic cross-sectional view illustrating a leakage path for a conventional continuous floating gate memory cell.
Figure 14:
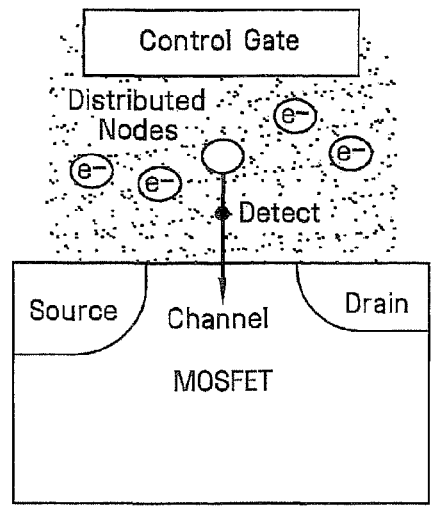
FIG. 14 is a schematic cross-sectional view illustrating a leakage path for a discrete charge storing nano crystal floating gate.

It will be understood that some embodiments of the present invention provide discrete charge storing nano crystals 130_NC. As such, as illustrated in FIG. 14, a single leakage path of the trapped charge electrons may be provided, as contrasted with the leakage characteristics of the continuous floating gate structure described above with reference to FIG. 2. In other words, leakage paths caused by defects or the like in the first dielectric layer 110 may cause only a limited amount of charge leakage allowing continued operation of the floating gate formed by the discrete charge storing nano crystals 130_NC.

As further described generally above for various embodiments of the present invention, process simplification may be provided by the methods described herein. Furthermore, ion diffusion may be limited or even prevented by a fine capping layer structure of the second dielectric layer 120. Annealing and stable nano crystal formation may be provided while still curing damage caused to the oxide layer during ion injection. For example, the two step annealing process described with reference to FIG. 4B above may be particularly beneficial in repairing such damage cause to the oxide layer 110 during ion injection. In addition, in some embodiments, low power and high speed operation of the resulting memory device including the charge trapping double layer 150 may be provided due to a blocking and coupling dielectric layer 140 having a high dielectric constant. Enhanced hysteresis characteristics on a C-V hysteresis curve may also be provided as described herein.

Figure 15:
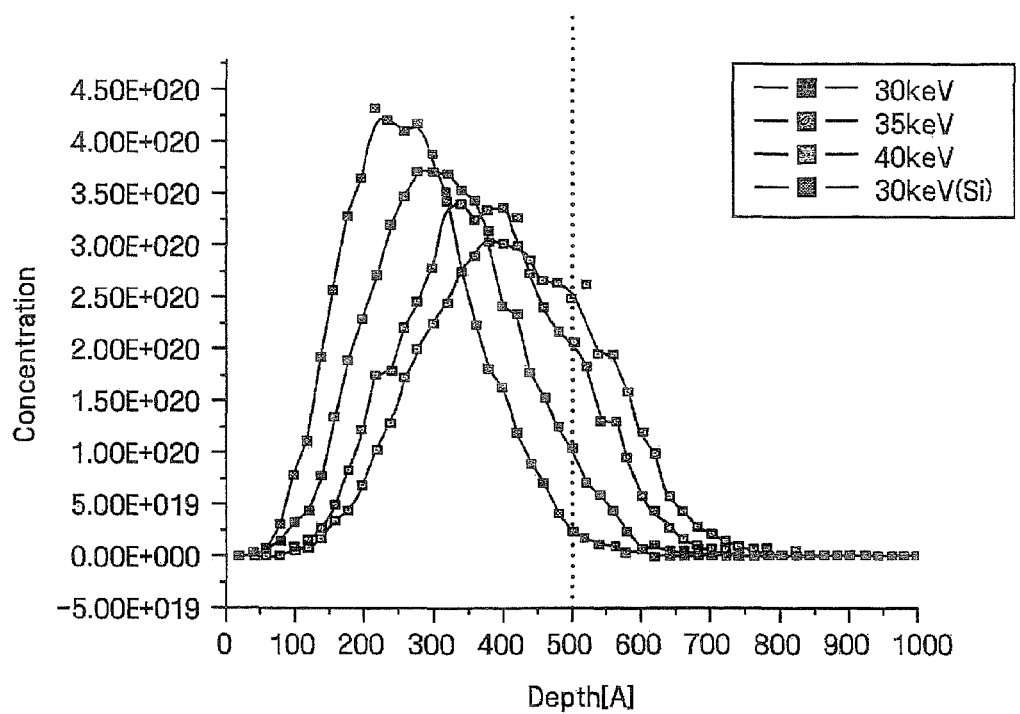
FIG. 15 is a diagram illustrating simulated implantation results according to some embodiments of the present invention.

Germanium ion implantation simulation results are illustrated in FIG. 15. More particularly, FIG. 15 illustrates simulation results for germanium ion implantation at an angle of 7° C. into a silicon oxide target layer having a thickness of 500 Å at the respective ion injection energies of 20 keV, 30 keV, 35 keV and 40 keV. The simulation results illustrated in FIG. 15 show a mean injection depth ($R_p$) of about 350 to about 400 Å with a delta projection range of about 80 Å to about 120 Å. The associated mean injection depth and delta projection range for the respective ion injection energies are shown in Table 3 below.

TABLE 3

| Energy | Rp | Delta Rp |
|---|---|---|
| 30 keV | 331.8 Å | 103.2 Å |
| 35 keV | 370.6 Å | 112.9 Å |
| 40 keV | 408.6 Å | 120.2 Å |
| 30 keV (Si) | 260.9 Å | 91.9 Å |

About Rp: 350-400 A
Delta Rp: 80-120 A

Referring again to the flow chart illustration of FIG. 16, a method of forming a gate stricture for an integrated circuit memory device will now be summarized. Operations begin by forming a low-k dielectric layer, such as a silicon oxide layer, as a first dielectric layer on an integrated circuit substrate (Block 1600). Ions of a selected element of group 4 of the periodic table, such as germanium, are injected into the first dielectric layer, for example, at an ion injection energy of greater than 7000 eV and an ion projection dose from about $1\times10^{14}/cm^2$ to about $2\times10^{16}/cm^2$ to form a charge storing region in the first dielectric layer with a tunnel dielectric layer of about no more than about 6 nm under the charge storing region and a capping dielectric layer above the charge storing region (Block 1610). A metal oxide second dielectric layer is formed on the first dielectric layer to a thickness, for example, of less than about 10 nm (Block 1620). The substrate with the first and second dielectric layers therein is thermally treated, for example, by rapid thermal annealing at a temperature of about 700° C. to about 900° C. for about 5 minutes to about 30 minutes to form a plurality of discrete charge storing nano crystals in the charge storing region (Block 1630). A gate electrode layer is formed on the second dielectric layer (Block 1640).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A gate structure for an integrated circuit device, comprising:
    an integrated circuit substrate;
    a single material first dielectric layer having a dielectric constant of under 7 and having an energy band gap of the single material on the substrate, the first dielectric layer including a tunnel dielectric layer on the substrate and a charge storing layer including a plurality of discrete nano-crystals of a selected element from group 4 of the periodic table and having a thermal diffusivity of less than about 0.5 centimeters per second ($cm^2/s$) on the tunnel dielectric layer;
    a second dielectric layer on the first dielectric layer, the second dielectric layer being a metal oxide and having a thickness of less than about 10 nm; and
    a gate electrode layer on the second dielectric layer.

2. The gate structure of claim 1, wherein the first dielectric further comprises a capping dielectric layer substantially free of nano-crystals on the charge storing layer and wherein the second dielectric layer is on the capping dielectric layer.

3. The gate structure of claim 1, wherein the second dielectric layer comprises a high-k dielectric layer and the first dielectric layer comprises a silicon oxide layer and the selected element comprises germanium (Ge).

4. The gate structure of claim 1, wherein the first and second dielectric layers have energy band gaps of at least about 5 electron volts (eV) and wherein the first dielectric layer has a thickness of less than about 17 nm and the thickness of the second dielectric layer is less than the thickness of the first dielectric layer.

5. The gate structure of claim 1, wherein the tunnel dielectric layer has a thickness of no more than about 6 nm.

6. The gate structure of claim 1, wherein the nano crystals have a diameter from about 1 nm to about 7 nm and a spacing between ones of the nano crystals is between about 1 nm and about 7 nm.

7. The gate structure of claim 1, wherein the second dielectric comprises an oxide and/or oxynitride of aluminum, hafnium, titanium, zirconium, scandium, yitrium and/or lanthanum.

8. The gate structure of claim 1 wherein the charge storing layer includes a multi-layer structure of overlapping ones of the discrete charge storing nano crystals.

9. The gate structure of claim 1, wherein the integrated circuit device comprises a non-volatile memory device or a dynamic random access memory (DRAM).

10. The gate structure of claim 1, wherein the integrated circuit device comprises a flash memory device and wherein the charge storing region comprises a floating gate of a cell of the flash memory device.

11. A memory cell including the gate structure of claim 1, the memory cell further comprising a common gate on a gate dielectric layer on the substrate and wherein the first dielectric layer extends along sidewalls of the common gate electrode and on a channel portion of the substrate proximate respective sides of the common gate and wherein the memory cell further includes sidewall gates on the second dielectric layer proximate the respective sides of the common gate and extending over the channel portion.

12. A memory cell including the gate structure of claim 1, the memory cell further comprising a channel region including a recess region and a step region adjacent the recess region extending between a source and a drain region in the substrate, wherein the step region and the recess region are formed under the gate electrode layer and wherein the first dielectric layer extends along the channel region including the recess region and the step region.

13. The memory cell of claim 12, wherein the recess region has a rounded portion.

* * * * *